United States Patent [19]
Homma et al.

[11] Patent Number: 5,247,198
[45] Date of Patent: Sep. 21, 1993

[54] SEMICONDUCTOR INTEGRATED CIRCUIT DEVICE WITH MULTIPLAYERED WIRING

[75] Inventors: Hideo Homma; Ryuichi Saito; Takashi Akioka, all of Hitachi; Yutaka Kobayashi, Katsuta, all of Japan

[73] Assignee: Hitachi, Ltd., Tokyo, Japan

[21] Appl. No.: 408,722

[22] Filed: Sep. 18, 1989

[30] Foreign Application Priority Data

Sep. 20, 1988 [JP] Japan .................. 63-233424

[51] Int. Cl.⁵ .......................... H01L 27/02
[52] U.S. Cl. .................. 257/371; 257/413; 257/751; 257/754
[58] Field of Search .......... 437/200, 40; 357/42, 357/67, 67 S, 71, 23.11, 23.4, 41, 65

[56] References Cited

U.S. PATENT DOCUMENTS

| | | | |
|---|---|---|---|
| 4,476,482 | 10/1984 | Scott et al. | 357/59 I |
| 4,700,215 | 10/1987 | McPherson | 357/71 |
| 4,746,219 | 5/1988 | Holloway et al. | 437/40 X |
| 4,903,096 | 2/1990 | Masuoka et al. | 357/71 |
| 4,920,391 | 4/1990 | Uchida | 357/23.4 |
| 5,034,791 | 7/1991 | Kameyama | 357/71 |

OTHER PUBLICATIONS

Adler, "Process For Fabricating Field Effect Transistors with Polysilicon Gates Containing Metal Silicide", IBM Tech Discl. Bull., vol. 26 No. 5 2309-2310 Oct. 1983.

C. Y. Ting and M. Wittmer "The Use of Titanium-Based Contact Barrier Layes in Silicon Technology" (1982) Thin Solid Films, 96 pp. 327-345.

Sequeda "The Role of Thin Film Materials on the Technology of Integrated Circuit Fabrication" (Nov. 1985) Journal of Metals, pp. 54-59.

Murarka "Refractory Silicides of Titanium and Tantalum for Low-Resistivity Gates and Interconnects" (1980) IEEE Journal of Solid-State Circuits, vol. SC 15 No. 4 pp. 474-481.

Primary Examiner—William Mintel
Assistant Examiner—R. Potter
Attorney, Agent, or Firm—Antonelli, Terry, Stout & Kraus

[57] ABSTRACT

A semiconductor integrated circuit device capable of having a high integration density and excellent performance and a method of fabricating the semiconductor integrated circuit device are disclosed. In this semiconductor integrated circuit device, a connecting conductor for connecting gate wiring which is formed on a field oxide film and extended from the gate of a MOSFET, to the source/drain region of another MOSFET is interposed between the gate wiring and one of two side space layers for defining the width of the gate wiring.

18 Claims, 8 Drawing Sheets

SEMICONDUCTOR INTEGRATED CIRCUIT DEVICE WITH MULTIPLAYERED WIRING

BACKGROUND OF THE INVENTION

The present invention relates to a semiconductor integrated circuit device, and more particularly to a semiconductor integrated circuit device with a structure suited to attain a high integration density or high performance, and a method of fabricating the semiconductor integrated circuit device.

Recently, the fabrication of a semiconductor large scale integration circuit device has been restricted by the interconnection technology for connecting diffusion regions having different conductivity types to each other and for connecting gate electrodes having different conductivity types to each other. Let us consider an integrated circuit having CMOS memory cells, by way of example. In order to make the memory cell small in size, it is necessary to connect the P+-type source/drain region of a PMOSFET, the N+-type source/drain region of NMOSFET, and the gate electrodes of the PMOSFET and the NMOSFET to each other. According to a conventional method, a wiring conductive layer is connected between the source/drain regions or gate electrodes through contact holes. In this case, the memory cell is obliged to be large in area, and thus it is impossible to improve the integration density or performance of the integrated circuit device. Further, in a case where a gate electrode is directly connected to a diffusion layer such as a source/drain region, there arises the following problem. The gate electrode is usually formed of a highly-doped, N-type, polycrystalline silicon layer (namely, N+-polysilicon layer) and a metal silicide layer which is made of the silicide of a metal having a high melting point, (for example, tungsten silicide $WSi_2$ layer). When the gate electrode is directly connected to the source/drain region of a PMOSFET (namely, P+-region), the dopant contained in the n+-polysilicon layer (for example, phosphorus) diffuses into the boundary between the N+-polysilicon layer and the P+-region. Hence, it is impossible to put the gate electrode in ohmic contact with the source/drain region, or the gate electrode may be shorted to the N-well region of the PMOSFET. Thus, the memory cell cannot perform the function thereof.

In order to solve the above problem, a method of connecting the gate electrode to the source/drain region has been proposed. According to this method, as described in a Japanese patent application JP-A-62-257749, a plurality of MOSFET's (that is, MOS transistors) are formed on a semiconductor substrate, and the source/drain region of each MOS transistor and the surface of each gate electrode made of polysilicon are exposed. Further, titanium is deposited on the surface, and the structure thus obtained is heated in an atmosphere of nitrogen to form titanium nitride and titanium silicide (TiN/$TiSi_2$) on a surface area where silicon is exposed, and to form titanium nitride (TiN) on an oxide film in a self-alignment manner. Thereafter, the TiN layer is selectively etched to form a desired pattern. Thus, the TiN layer can be kept in contact with the surfaces of the gate electrode and the source/drain region. According to the above method, the TiN layer acts as the conductive diffusion barrier for a dopant. Hence, the TiN layer having a relatively small area can be put in ohmic contact with each of the gate electrode and source/drain region which are opposite in conductivity type to each other. In the above method, however, the TiN layer serving as a connecting conductor is etched so as to be put in contact with each of the gate electrode and the source/drain region. When the mask alignment accuracy in photolithograph and other factors are taken into consideration, it is necessary to make an area where the TiN layer is to be put in contact with each of the gate electrode and the source/drain electrode, sufficiently large. Accordingly, the improvement in integration density and performance of a semiconductor integrated circuit device is limited.

Further, an LDD (light-doped drain) MOSFET has been proposed to form a semiconductor integrated circuit device having a high integration density. An example of the LLDMOSFET is described on pages 38 to 41 of the IEDM 87. It has been earnestly desired to develop a structure capable of miniaturizing the LDDMOSFET and a method of fabricating the structure.

SUMMARY OF THE INVENTION

It is an object of the present invention to provide a semiconductor integrated circuit device which has a structure suited to attain a high integration density or high performance, and a method of fabricating the device.

It is another object of the present invention to provide a semiconductor integrated circuit device, in which two regions on a semiconductor substrate can be connected to each other through a conductive layer in such a manner that the conductive layer is put in contact with only a very small area of each of the regions, and a method of fabricating the device.

According to an aspect of the present invention, there is provided a semiconductor integrated circuit device, in which a conductive diffusion barrier is put in contact with an end face of at least one of two regions to be connected to each other.

According to another aspect of the present invention, there is provided a semiconductor integrated circuit device, in which one of wiring conductors extended from two regions to be connected to each other, is connected to the other wiring conductor through a conductive diffusion barrier.

According to a further aspect of the present invention, there is provided a semiconductor integrated circuit device, in which the gate electrode of an LLDMOSFET is separated into a plurality of parts, and the parts are connected to each other.

The above and other objects and features of the present invention will become apparent from the following description.

DESCRIPTION OF THE PREFERRED EMBODIMENTS

The gist of the present invention resides in that a conductive diffusion barrier is put in contact with toe end face of at least one of regions (which are to be connected to each other, or is put in contact with conductors extended from regions which are to be connected to each other. Accordingly, the present invention can solve the drawback of the prior art, that is, the problem that an area where the conductive diffusion barrier and each of the above regions overlap, has to be made so large that the conductive diffusion barrier is surely put in contact with each region even when the mask alignment accuracy is low. Thus, according to the present invention, a semiconductor integrated circuit device can be readily obtained which is high in integration density and excellent in performance. The conductive diffusion barrier used in the present invention means a conductor capable of acting as a diffusion barrier. In other words, the conductive diffusion barrier can be put in ohmic contact with each of regions which are to be connected to each other and are opposite in conductivity type to each other. In more detail, even when heat treatment is carried out, for example, at a temperature of 800° to 950° C., the ohmic contact between conductive diffusion barrier and each region is kept unchanged, since the dopant contained in each region does not diffuse into the conductive diffusion barrier.

The above and other features and advantages of the present invention will become apparent from the following description.

EMBODIMENT I

Now, explanation will be made of a first embodiment of a CMOS memory cell according to the present invention, with reference to FIGS. 1A to 1E, 2 and 3. FIG. 2 is a plan view showing the first embodiment, and FIG. 1E is a sectional view taken along the line C—C' of FIG. 2. Further, FIGS. 1A to 1D are sectional views for explaining a method of fabricating the first embodiment. It is to be noted that a PMOS transistor P1 shown in FIG. 2 is omitted from FIGS. 1A to 1D for brevity's sake.

Figure 1A:
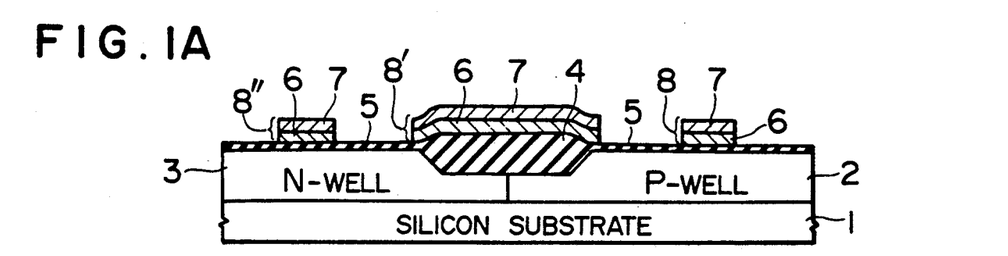
FIGS. 1A to 1E are sectional views for explaining a method of fabricating a first embodiment of a CMOS memory cell according to the present invention.
Figure 2:
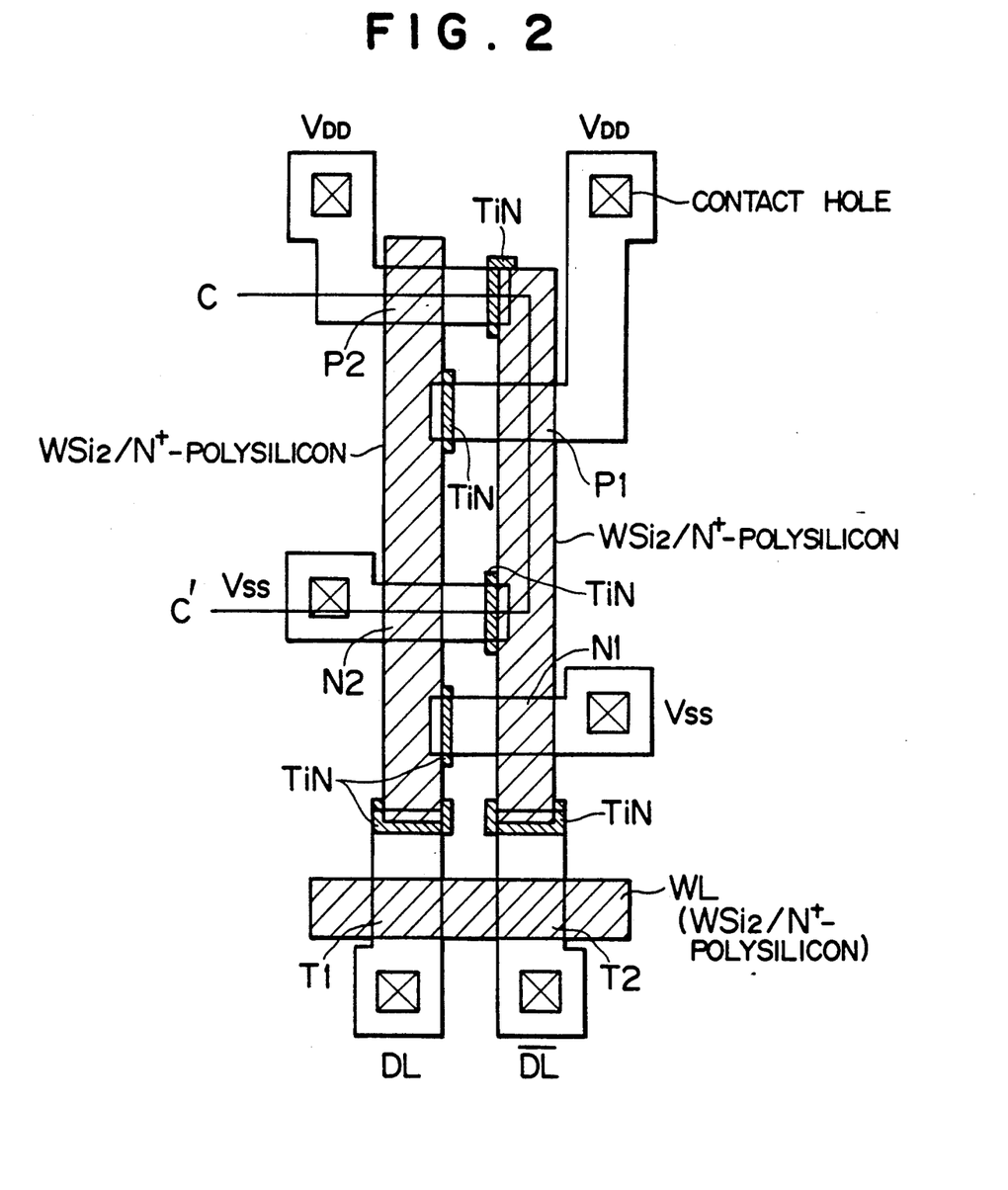
FIG. 2 is a plan view showing the first embodiment which is fabricated by the method shown in FIGS. 1A to 1E.

Referring first to FIG. 1A, a P well region 2 and an N-well region 3 are formed in the principal surface of a silicon substrate 1. Next, a field oxide film (that is, LOCOS film) 4 for isolating the well regions 2 and 3 from each other and a gate oxide film 5 are formed. Thereafter, a polysilicon film is deposited on the whole of the surface to a thickness of 1,000 Å by the chemical vapor deposition method, and then phosphorus is thermally diffused into the polysilicon film, to form a highly-doped N-polysilicon film (namely, $N^+$-polysilicon film) 6. Next, a tungsten silicide ($WSi_2$) film 7 is formed on the $N^+$-polysilicon film 6 by a sputtering method. Thereafter, the two-layer film formed of the $WSi_2$ film 7 and the $N^+$-polysilicon film 6 is etched through photoetching techniques so that gate electrodes 8, 8' and 8" are left on the P-well region 2, an area bestriding the boundary between the P-well region and the N-well region, and the N-well region 3, respectively.

Figure 1B:
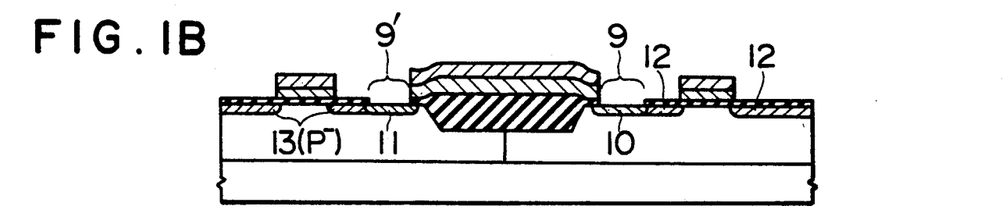

Next, a photoresist film is formed on the surface, and an opening is formed in the photoresist film at an area which is adjacent to the gate electrode 8' on the P-well side, through photolithography. Then, arsenic ions are implanted in that portion of the P-well region 2 which exists under the opening, at an accelerating voltage of 50 KV and at a dose of $5 \times 10^{15}$ cm$^{-2}$ to form a highly-doped N-layer (namely, $N^+$-layer) 10 in the P-well region 2 as shown in FIG. 1B. Further, selective etching is carried out for the gate oxide film 5 while using the photoresist film as a mask, to form an opening 9 on the $N^+$-layer 10. At this time, an aqueous solution of hydrofluoric acid is used as an etchant. Similarly, boron ions are implanted in a portion of the N-well region 3 at an accelerating voltage of 40 KV and at a dose of $2 \times 10^{15}$ cm$^{-2}$ to form a highly-doped P-layer (namely, $P^+$-layer) 11, and then an opening 9' is formed on the $P^+$-layer 10 by selectively etching the gate oxide film 5. Next, phosphorus ions are implanted in the whole surface of the P-well region, to form a source/drain region 12 which is a lightly-doped N-layer (namely, $N^-$-layer), and boron ions are implanted in the whole surface of the N-well region, to form a source/drain region 13 which is a lightly-doped P-layer (namely, $P^-$-layer).

Figure 1C:
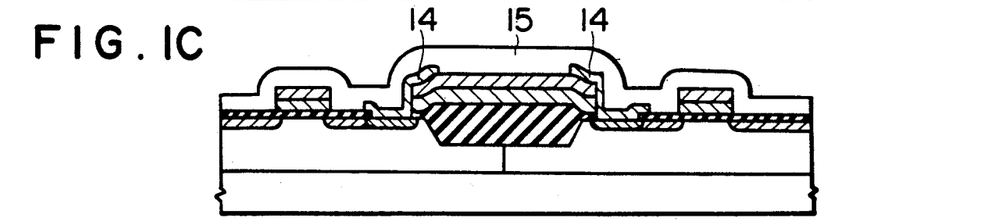

Next, a conductive diffusion barrier film, for example, a titanium nitride (TiN) film 14 is deposited on the whole of the surface to a thickness of 1,000 Å by a sputtering method (for example, reactive sputtering method). The TiN film 14 is selectively etched so that the TiN film 14 on the layers 10 and 11 and the TiN film 14 on at least a part of the side face of the gate electrode 8' are left unetched as shown in FIG. 1C. Then, an $SiO_2$ film 15 is formed on the whole of the surface by the chemical vapor deposition method.

Figure 1D:
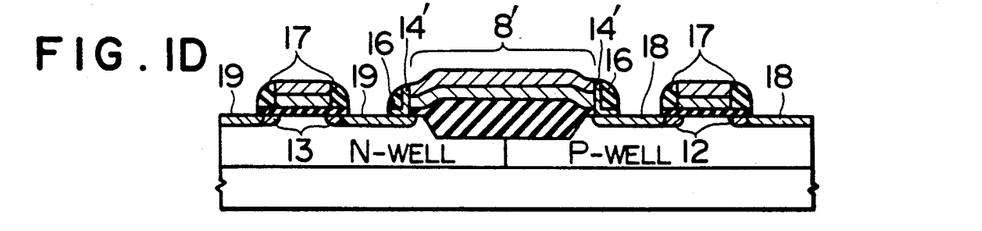
Figure 1E:
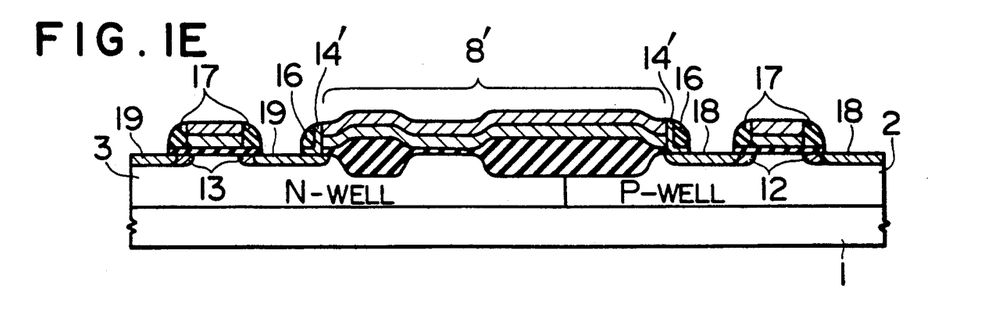

Next, as shown in FIG. 1D, the $SiO_2$ film 15 is etched by the anisotropic dry etching method using an etching gas which contains $CHF_3$ as a main component, so that a side spacer 16 or 17 is left on the side faces of each of the gate electrodes 8, 8' and 8". That portion of the TiN film 14 which is not covered by the side spacer 16, is etched by a mixed solution containing aqueous ammonia ($NH_4OH$), an aqueous solution of hydrogen peroxide ($H_2O_2$) and pure water ($H_2O$). Next, arsenic ions are implanted in the P-well region at an ion accelerating voltage of 50 KV and at a dose of $5 \times 10^{15}$ cm$^{-2}$, to form a source/drain region 18 which is a highly-doped N-layer (namely, $N^+$-layer). Then, boron ions are implanted in the N-well region at an ion accelerating voltage of 40 KV and at a dose of $2 \times 10^{15}$ cm$^{-2}$, to form a source/drain region 19 which is a highly-doped P-layer (namely, $P^+$-layer). Thus, a main process for fabricating the first embodiment is completed. Incidentally, FIG. 1E includes that portion of the gate electrode 8' which exists on a PMOS transistor P1, and the PMOS transistor P1 is indicated by a region sandwiched between two LOCOS films of FIG. 1E.

Figure 3:
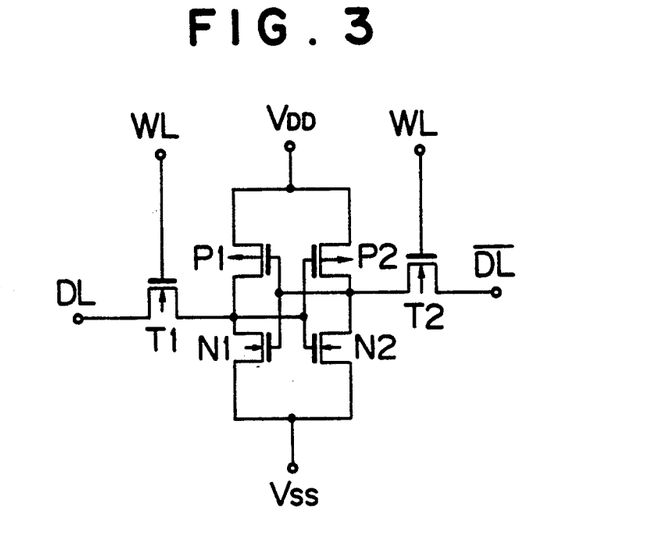
FIG. 3 is a circuit diagram showing the circuit construction of the first embodiment of FIG. 2.

In the first embodiment fabricated in the above-mentioned manner, as is apparent from FIGS. 1D and 1E, the gate electrode 8' (that is, gate wiring) is connected to each of the N+-source/drain region 18 and the P+-source/drain region 19 by a TiN film 14' which is defined by the side face of the gate electrode 8' and the length of the side spacer 16 in a lateral direction (namely, spacer length). Accordingly, the TiN film 14' can be kept in contact with each of the gate electrode 8', the N+-source/drain region 18 and the P+-source/-drain region 19 at a very small area, without taking into consideration the mask alignment accuracy and others. FIG. 2 shows the surface pattern of the first embodiment (that is, 1-bit CMOS memory cell) formed by the abovementioned method, and FIG. 3 shows the circuit construction of the first embodiment. As shown in FIGS. 2 and 3, the first embodiment includes a flip-flop circuit made up of two PMOS transistors P1 and P2 and two NMOS transistors N1 and N2, and two NMOS transistors T1 and T2 acting as transfer elements.

Specifically, as shown in FIG. 2, in a CMOS type memory integrated circuit device comprising at least one memory cell made up of comprising a flip-flop circuit and first and second transfer MOSFET $T_1$, $T_2$, it has a feature such that the flip-flop circuit includes first and second P-channel MOSFETs $P_1$, $P_2$ and first and second driver N-channel MOSFETs $N_1$, $N_2$, each source/drain region of the first P-channel MOS $P_1$, driver N-channel MOS $N_1$ and transfer MOS $T_1$ FETs are connected to a gate electrode in common for the second P-channel $P_2$ and driver N-channel MOS $N_2$ FETs by means of a diffusion barrier material TiN respectively, each source/drain region of the second P-channel MOS $P_2$, driver-N channel MOS $N_2$ and transfer MOS $T_2$ FETs are connected to a gate electrode in common for the first P-channel MOS $P_2$ FET and the first driver N-channel MOS $N_2$ FET by means of a diffusion barrier material TiN respectively; and the diffusion barrier materials being provided inside of the side wall oxidation film (16 in FIG. 1) provided at the side of the gate electrodes. As is apparent from FIG. 2, the gate electrode formed of the two-layer film, that is, the gate electrode formed of the WSi$_2$ film and the N+-polysilicon film is connected to that area of each of the source/drain regions of the NMOS transistor T1, NMOS transistor T2, NMOS transistor N1, NMOS transistor N2, PMOS transistor P1, and PMOS transistor P2 which is defined only by the spacer length in a lateral direction. Accordingly, the first embodiment can be made in size. That is, a semiconductor integrated circuit device including a multiplicity of first embodiments can be made high in integration density and performance.

EMBODIMENT II

Figure 4A:
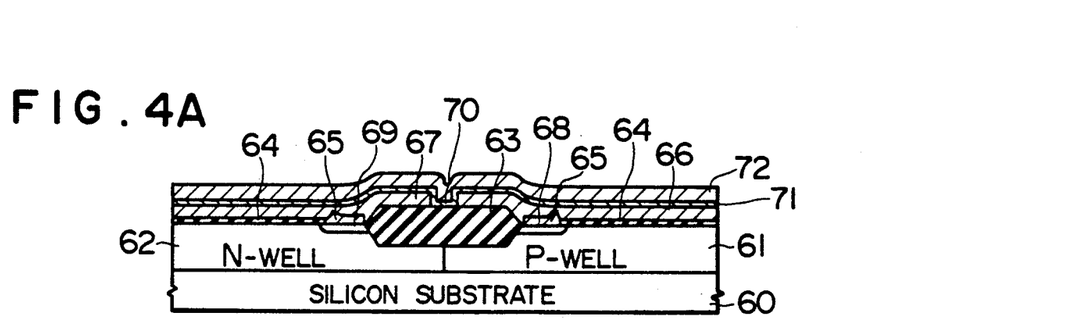
FIGS. 4A to 4D are sectional view for explaining a method of fabricating a second embodiment of a CMOS memory cell according to the present invention.
Figure 4B:
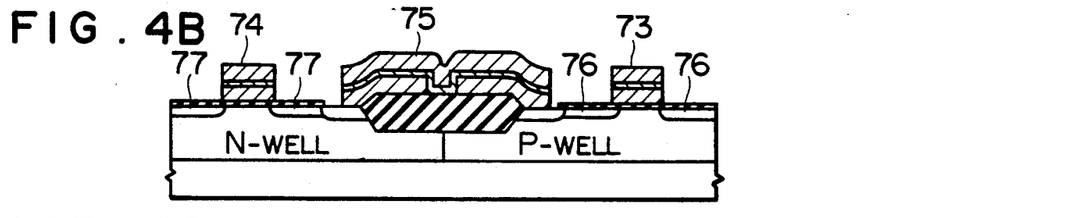
Figure 4C:
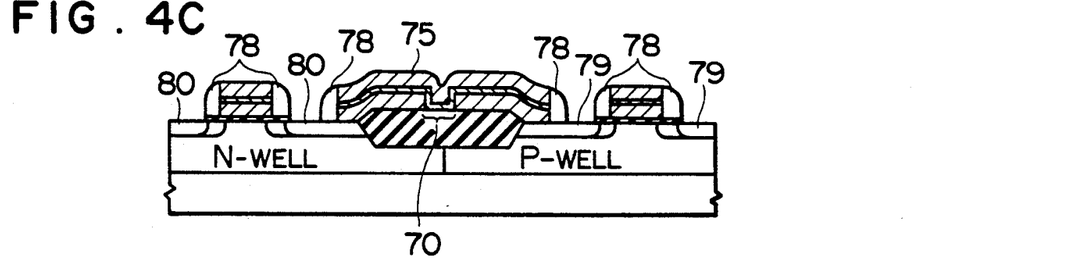
Figure 4D:
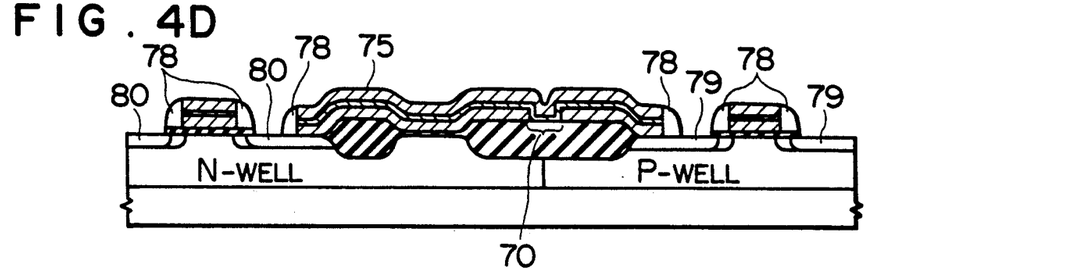

Next, explanation will be made of a second embodiment of a CMOS memory cell according to the present invention, with reference to FIGS. 4A to 4D are 5. FIG. 4A to 4C are sectional views for explaining a method of fabricating the second embodiment, and FIG. 4D is a sectional view taken along the B—B' line of FIG. 5 which is a plan view showing the second embodiment. As is apparent from FIG. 5, the second embodiment has the same circuit construction as shown in FIG. 3. Incidentally, that portion of FIG. 4D which corresponds to the PMOS transistor P1, is omitted from FIGS. 4A to 4C for the sake of brevity.

Referring to FIG. 4A, a P-well region 61 and an N-well region 61 are first formed in the principal surface of a silicon substrate 60. Next, a field oxide film 63 for isolating the well regions 61 and 62 from each other and a gate oxide film 64 are formed. Then, a portion of that part of the gate oxide film 64 which exists on the P-well region, and a portion of that part of the gate oxide film 64 which exists on the N-well region, are removed through photo-etching techniques, to form openings 65. Next, a polysilicon film is deposited on the whole of the surface to a thickness of 1,000 Å by the chemical vapor deposition method, and a groove 70 is formed in the polysilicon film at the surface of the field oxide film 63 to separate the polysilicon film into the polysilicon film on the P-well side and the polysilicon film on the N-well side. Then, BF$_2$ ions are implanted in the polysilicon film on the N-well side at an accelerating voltage of 40 KV and at a dose of $5 \times 10^{15}$ cm$^{-2}$, and arsenic ions are implanted in the polysilicon film on the P-well side at an accelerating voltage of 50 KV and at a dose of $2 \times 10^{15}$ cm$^{-2}$. The structure thus obtained is heated at 800° C. for about ten minutes, to form an N+-polysilicon film 66 and a P+-polysilicon film 67, and to form an N+-diffusion layer 68 and a P+-diffusion layer 69 in the P-well region 61 and the N-well region 62, respectively. Next, a conductive diffusion barrier film, for example, a TiN film 71 is deposited on the whole of the surface to a thickness of 1,000 Å by a sputtering method, and a WSi$_2$ film 72 is deposited on the TiN film 71 to a thickness of 1,500 Å by a sputtering method. Then, as shown in FIG. 4B, the three-layer film formed of the WSi$_2$ film 72, the TiN film 71 and the N+-polysilicon film 66 or P+-polysilicon film 67, is selectively etched by the dry etching using, for example, an etching gas which contains CCl$_4$ as a main component, so as to leave gate electrodes 73, 74 and 75 unetched. Next, ion implanation is carried out while using the gate electrodes 73, 74 and 75 as a mask. That is, phosphorus ions are implanted in the P-well region 61 at a small-dose to form an N$^-$-source/drain region 76, and boron ions are implanted in the N-well region 62 at a small dose to form a P$^-$-source/drain region 77. Next, as shown in FIG. 4C, an SiO$_2$ film is deposited on the whole of the surface to a thickness of 3,000 Å by the chemical vapor deposition method, and then the SiO$_2$ film is etched through anisotropic dry etching techniques so that the SiO$_2$ film on the side face of each gate electrode is left unetched. The unetched SiO$_2$ film serves as a side spacer 78. Next, ion implantation is carried out while using the gate electrodes 73, 74 and 75 as a mask. That is, arsenic ions are implanted in the P-well region 61 at a large dose, and boron ions are implanted in the N-well region 62 at a large dose. Then, heat treatment is carried out at an appropriate temperature for a predetermined time, to form an N+-source/drain region 79 and a P+-source/drain region 80. Thus, a main process for fabricating the second embodiment is completed.

Figure 5:
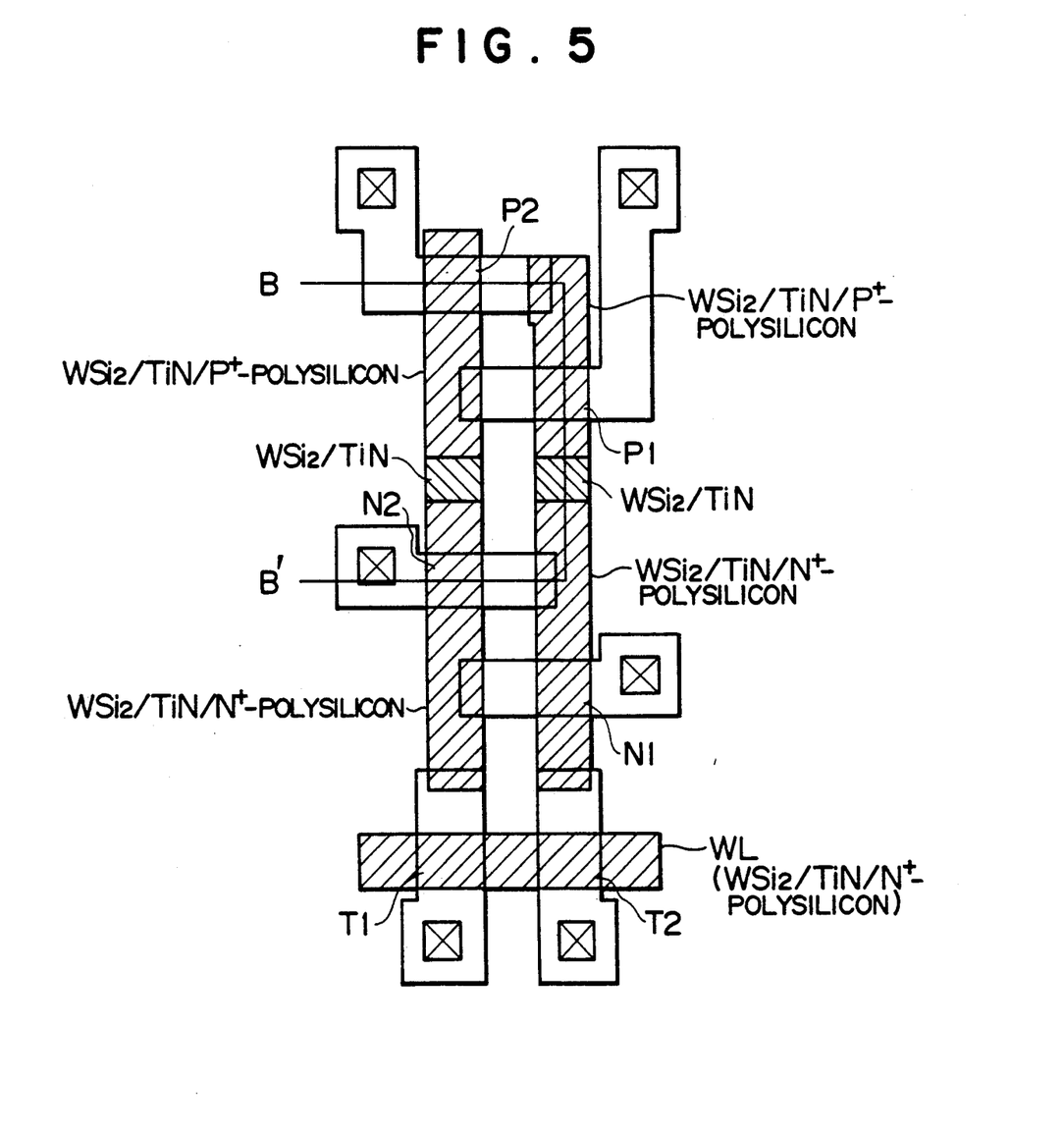
FIG. 5 is a plan view showing the second embodiment which is fabricated by the method shown in FIGS. 4A to 4D.

FIG. 5 shows the surface pattern of the second embodiment (that is, 1-bit CMOS memory cell) fabricated by the above method. As can be seen from FIGS. 4C, 4D and 5, the N+-polysilicon film 66 and P+-silicon film 67 of the gate electrode 75 are kept in contact with the N+-source/drain region 79 and the P+-source/drain region 80, respectively. Accordingly, it is only required to satisfy a condition that the gate electrode 75 and the source/drain region 79 or 80 overlap each other. Hence, the second embodiment can be made small in size. Further, the gate electrode 75 can be put in low-resistance contact with the source/drain region 79 or 80, since two silicon layers are kept in contact with each other. While, the two-layer film formed of the TiN film 71 and the WSi$_2$ film 72 and having the same width as the gate electrode 75 is used for connecting the N+-polysilicon film 66 and the P+-polysilicon film 67. In other words, the polysilicon films 66 and 67 can be connected to each other by that portion of the two-layer film which corresponds to the bottom of the groove 70. That is, a conductor having a small area is sufficient to connect the polysilicon films 66 and 67. Further, the WSi$_2$ film 72 having a relatively large area is connected to the N+-polysilicon film 66 and the P+-polysilicon film 67 which have a total area substantially equal to the area of the WSi$_2$ film 72, through the TiN film 71. Accordingly, the resistance between the WSi$_2$ film 72 and the polysilicon films 66 and 67 is very low.

In the second embodiment, the N+-polysilicon layer is used for forming the gate electrode 73 of the NMOS transistor, and the P+-polysilicon layer is used for forming the gate electrode 74 of the PMOS transistor. Accordingly, it is not required particularly for the PMOS to provide an inverted p-type channel region such as provided for N+ polysilicon gates used usually. Thus, the short channel characteristics of the PMOS transistor of the second embodiment can be improved in a great degree. As can be seen from the above explanation, a semiconductor integrated circuit device including a multiplicity of second embodiments can be made high in integration density and performance. Although the gate electrodes of the PMOS and NMOS transistors of the second embodiment include the P+-polysilicon film and the N+-polysilicon film, respectively, the gate electrodes of the PMOS and NMOS transistors may include an N+-polysilicon film and a P+-polysilicon film, respectively.

EMBODIMENT III

Figure 9:
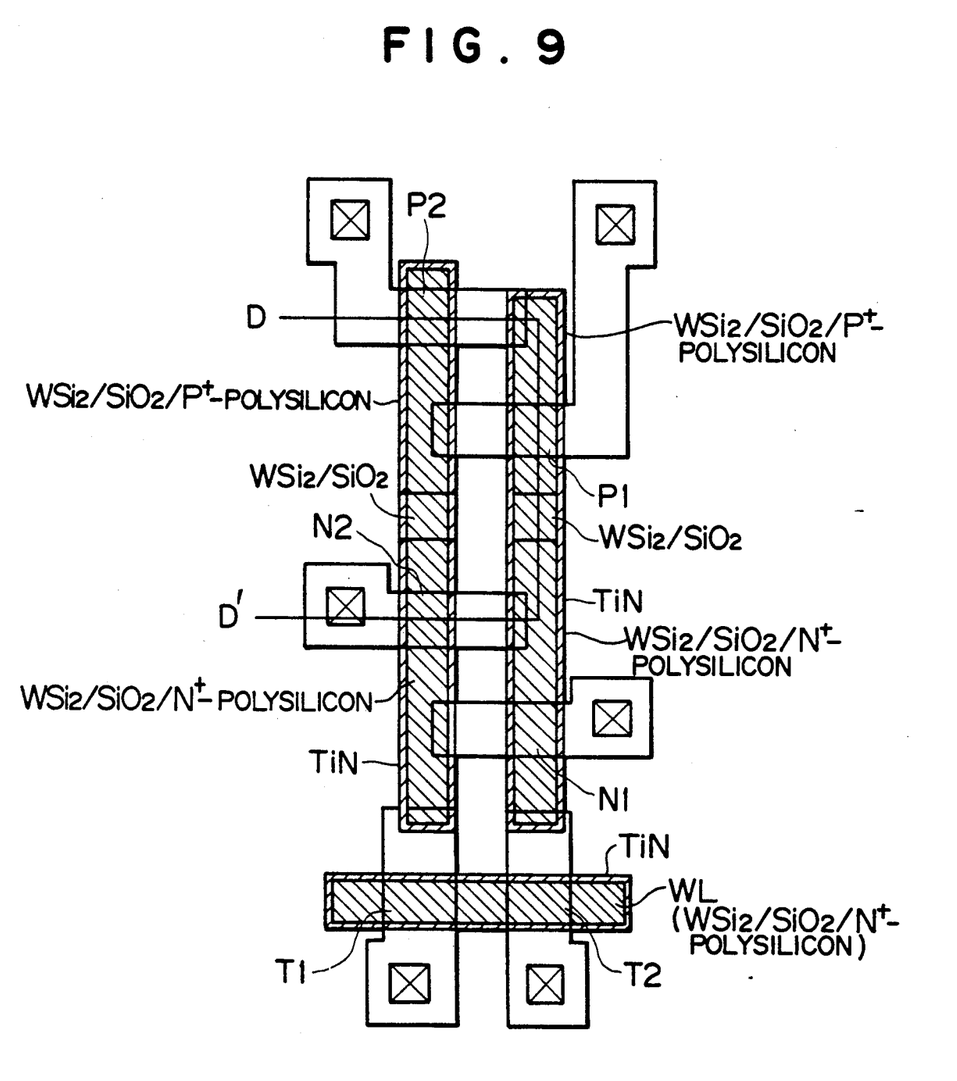
FIG. 9 is a plan view showing the third embodiment which is fabricated by the method shown in FIGS. 6A to 6E.

Next, explanation will be made of a third embodiment of a CMOS memory cell according to the present invention, with reference to FIGS. 6A to 6E and 9. FIGS. 6A to 6D are sectional views for explaining a method of fabricating the third embodiment, and FIG. 6E is a sectional view taken along the line D—D' of FIG. 9 which shows the surface pattern of the third embodiment. It is to be noted that a portion corresponding to the PMOS transistor PI of FIG. 9 is included in FIG. 6E, but is omitted from FIGS. 6A to 6D for brevity's sake.

Figure 6A:
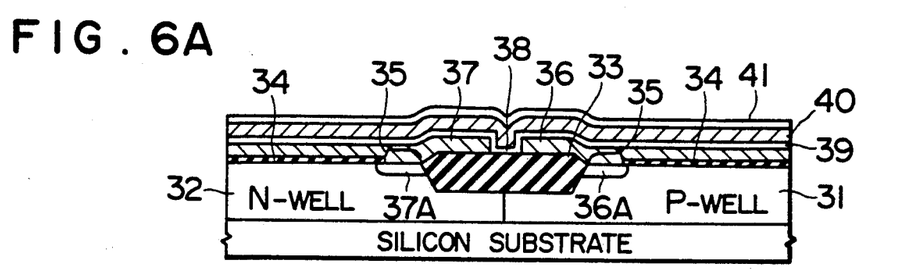
FIGS. 6A to 6E are sectional views for explaining a method of fabricating a third embodiment of a CMOS memory cell according to the present invention.

First, as shown in FIG. 6A, a P-well region 31 and an N-well region 32 are formed in the principal surface of a silicon substrate 30. Then, a field oxide film 33 for isolating the well regions 31 and 32 from each other and a gate oxide film 34 are formed. Next, a portion of the gate oxide film on the P-well region 31 and a portion of the gate oxide film on the N-well region 32 are removed through photoetching techniques, to form openings 35. Then, a polysilicon film is deposited on the whole of the surface to a thickness of 1,000 Å by the chemical vapor deposition method. A groove 38 is formed in the polysilicon film at the surface of the field oxide film 33 through photoetching techniques to separate the polysilicon film into the polysilicon film on the P-well side and the polysilicon film on the N-well side. Next, BF$_2$ ions are implanted in the polysilicon film on the N-well side at an ion accelerating voltage of 40 KV and at a dose of $2\times10^{15}$ cm$^{-2}$, and arsenic ions are implanted in the polysilicon film on the P-well side at an ion accerating energy of 50 KV and at a dose of $2\times10^{15}$ cm$^{-2}$. The structure thus obtained is heated at 800° C. for about 10 minutes, to form an N+-polysilicon film 36 and a P+-polysilicon film 37, and to form an N+-diffusion layer 36A and a P+-diffusion layer 37A in the P-well region 31 and the N-well region 32, respectively. Next, an SiO$_2$ film 39 is deposited on the surface to a thickness of 500 Å by the chemical vapor deposition method. Then, a WSi$_2$ film 40 is deposited on the SiO$_2$ film 39 to a thickness of 2,000 Å by a sputtering method, and another SiO$_2$ film 41 is deposited on the WSi$_2$ film 40 to a thickness of 2,000 Å by the chemical vapor deposition method.

Figure 6B:
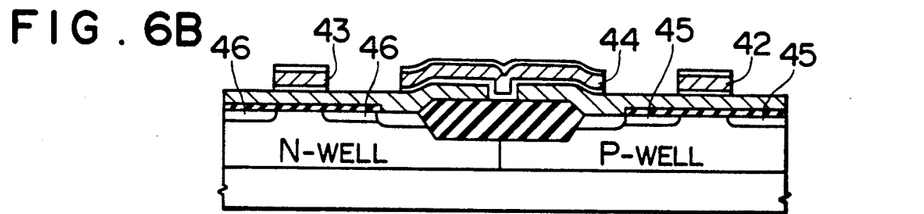

Next, as shown in FIG. 6B, the films 41, 40 and 39 are selectively etched through photoetching techniques so that upper gate electrodes 42, 43 and 44 are left unetched. Then, ion implantation is carried out while using the upper gate electrodes as a mask. That is, phosphorus ions are implanted in the P-well region 31 through the N+-polysilicon film 36 at a small dose to form an N−-source/drain region 45, and boron ions are implanted in the N-well region 32 through the P+-polysilicon film 37 at a small dose to form a P−-source/drain region 46.

Figure 6C:
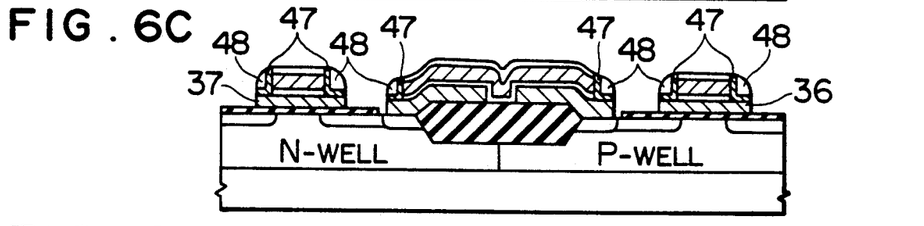

Referring to FIG. 6C, a TiN film is then deposited on the whole of the surface to a thickness of 1,000 Å by a sputtering method. Next, an SiO$_2$ film is deposited on the TiN film to a thickness of, for example, 3,500 Å by the chemical vapor deposition method. Then, the SiO$_2$ film is etched through anisotropic dry etching techniques so that an SiO$_2$ layer serving as a side spacer 48 is left on the side face of each of the upper gate electrodes 42, 43 and 44. Then, dry etching is carried out for the TiN film, the N+-polysilicon film 36 and the P+-polysilicon film 37, while using the side spacer 48 and the SiO$_2$ film 41 as a mask. Thus, that portion of the TiN film 47 which is covered with the side spacer 48 is left unetched, and the unetched TiN film 47 is put in ohmic contact with the WSi$_2$ film of each upper gate electrode and one of the N+-polysilicon film 36 and the P+-polysilicon film 37 each serving as a lower gate electrode.

Figure 6D:
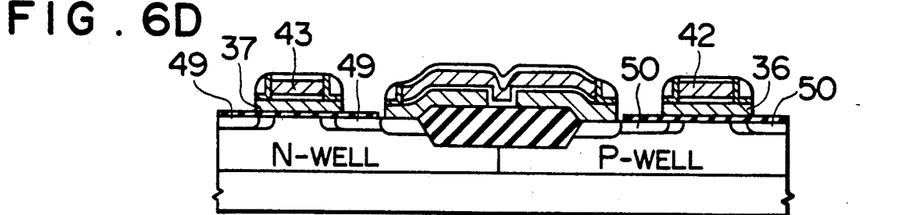
Figure 6E:
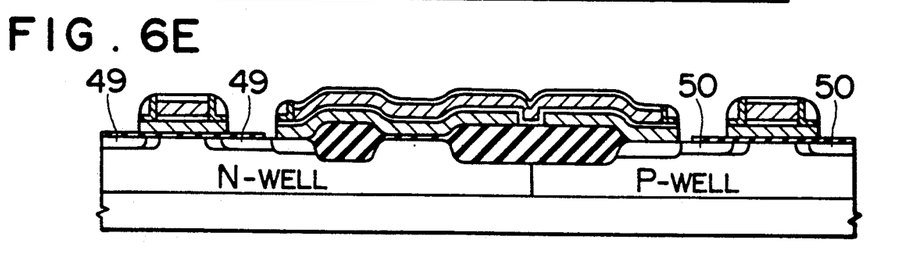

Next, ion implantation is carried out for the well regions 31 and 32, while using the gate electrodes 42 and 43 as a mask. That is, arsenic ions are implanted in the P-well region at an ion accelerating voltage of 50 KV and at a dose of $5\times10^{15}$ cm$^{-2}$ and BF$_2$ ions are implanted in the N-well region at an ion accelerating voltage of 40 KV and at a dose of $2\times10^{15}$ cm$^{-2}$, and then heat treatment is carried out to form an N+-source/drain region 50 and a P+ source/drain region 49 as shown in FIG. 6D. Thus, a main process for fabricating the third embodiment is completed. It is to be noted that the polysilicon films 36 and 37 extended from the surface of the field oxide film 33 are put in contact with the P-well region and the N-well region, respectively. Since the P-well region and the N-well region are made of silicon, the above polysilicon films 36 and 37 can be kept in low-resistance contact with the well regions.

FIG. 9 shows the surface pattern of the third embodiment (that is, 1-bit CMOS memory cell). As is apparent from FIGS. 6D, 6F and 9, the gate electrode 44 (that is, gate wiring) is connected to the N+-source/drain region 50 by the N+-polysilicon film 36, and the gate electrode 44 is connected to the P+-source/drain region 49 by the P+-polysilicon film 37. Accordingly, it is only required to satisfy a condition that the gate electrode 44 and the N+- or P+-source/drain region overlap each other. Further, the N+-polysilicon film 36 is connected to the P+-polysilicon film 37 by the TiN film 47 which is defined by the end face of the $WSi_2$ film 40 of the gate electrode 44 and the length of the side spacer 48 in a lateral direction (namely, spacer length) in a self-alignment manner. Accordingly, when the TiN film 47 is selectively etched, it is unnecessary to take mask alignment accuracy into consideration. In other words, the third embodiment can be very small in size.

Further, in the NMOS transistor of the third embodiment, the lower gate electrode kept in contact with the gate oxide film 34 is formed of the N+-polysilicon film 37. In the PMOS transistor of the third embodiment, the lower gate electrode kept in contact with the gate oxide film 34 is formed of the P+-polysilicon film 37. In the conventional PMOS transistor provided with an N+-polysilicon gate, a channel region is changed to the P-type, to adjust a threshold voltage. According to the third embodiment, it is unnecessary to invert the channel region of a PMOS transistor, and thus the short channel characteristics of the PMOS transistor is improved in a great degree. Further, the N−-source/drain region of the NMOS transistor and the lower gate electrode thereof (namely, N+-polysilicon layer) overlap each other, and the P−-source/drain region of the PMOS transistor and the lower gate electrode thereof (namely, P+-polysilicon layer) overlap each other. Accordingly, when a gate voltage for forming a channel layer is applied to the gate of each of the NMOS and PMOS transistors, carriers are accumulated in the surface of each of the N−-source/drain region and the P−-source/drain region, and thus the ON-resistance of MOS transistor is reduced. That is, the third embodiment can prevent a reduction in mutual conductance (gm) due to ON-resistance which is observed in a conventional LDDMOS (lightly-doped drain MOS) transistor. Thus, a semiconductor integrated circuit device including a multiplicity of third embodiments can perform a high speed operation.

EMBODIMENT IV

Figure 7:
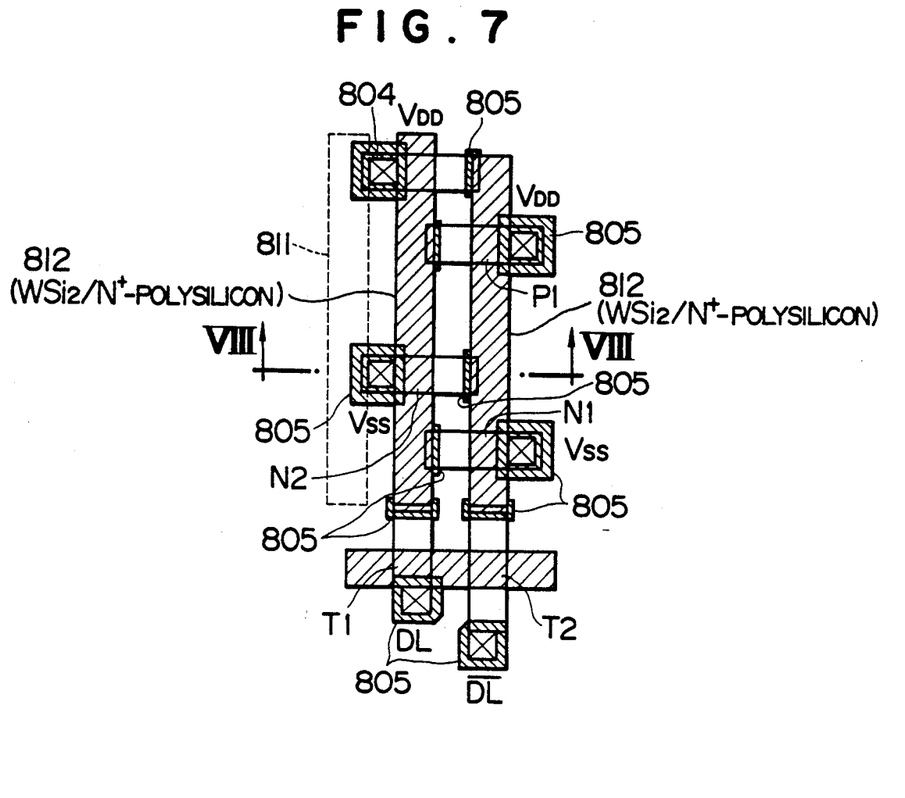
FIG. 7 is a plan view showing a fourth embodiment of a CMOS memory cell according to the present invention.
Figure 8:
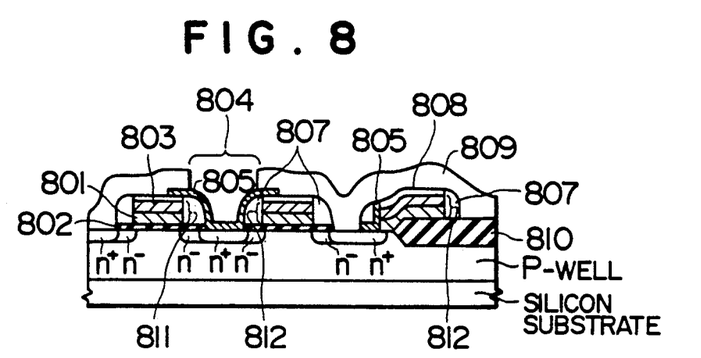
FIG. 8 is a sectional view taken along the line A—A' of FIG. 7.

Next, explanation will be made of a fourth embodiment of a CMOS memory cell according to the present invention, with reference to FIGS. 7 and 8. FIG. 7 is a plan view showing the fourth embodiment (that is, 1-bit CMOS memory cell having the same circuit construction as shown in FIG. 3), and FIG. 8 is a sectional view taken along the line A—A' of FIG. 7. In FIGS. 7 and 8, reference numeral 801 designates an N+-polysilicon film, 802 a gate 2 oxide film, 803 a $WSi_2$ film, 804 a contact hole, 805 a TiN film, 807 a spacer made of $SiO_2$, 808 an $SiO_2$ film, 809 an interlayer dielectrics (film), 810 a field oxide film, and 811 the gate electrode of an adjacent memory cell. As shown in FIGS. 7 and 8, a gate electrode 812 which is formed of the $WSi_2$ film 803 and the N+-polysilicon film 801, is connected to an N+-source/drain region by the TiN film 805 which is defined by the end face of the gate electrode 812 and the lateral length of the spacer 807 and is formed in a self-alignment manner, similarly to the TiN film 14' of FIG. 1. Accordingly, it is easy to make the connecting portion between the gate electrode 12 and the N+-source/drain region small in size. Further, the TiN film 805 is provided in the contact hole 804 as shown in FIG. 8, to form a pad electrode. Accordingly, the contact hole 804 is not required to be spaced apart from the gate electrode 812 formed of the N+-polysilicon film 801 and the $WSi_2$ film 803. Thus, the fourth embodiment can be made small in size. Further, the TiN film 805 acts as an excellent reaction barrier for an aluminum electrode. That is, the connection of the aluminum wiring electrode to the N+-source/drain region through the TiN film 805 is superior in stability of contact to a case where the aluminum wiring electrode is connected directly to the N+-source/drain region. Accordingly, a semiconductor integrated circuit device including a multiplicity of fourth embodiments is excellent in reliability. As explained with the embodiment 1, the area reduction of more than 7% (in comparison with those by conventional methods) can be achieved in the case of connecting through the diffusion barrier the gate of the length defined by the gate end face to the diffusion layer of the MOS FET of the length defined by the side wall or spacer length. In the case of the structure explained with the embodiment IV, the area reduction of more than 19% can be achieved.

In the first to fourth embodiment, the TiN film is used as a conductive diffusion barrier. However, the TiN film may be replaced by one of other conductive films capable of acting as a diffusion barrier, for example, a film made of one of tungsten nitride, molybdenum nitride, tantalum nitride and other, or an alloy film containing silicon, nitrogen, and one of tungsten, molybdenum, tantalum and titanium.

In the first to fourth embodiments, the TiN film is put in contact with two regions which are to be connected to each other. However, a film made of the silicide of a metal having a high melting point may be interposed between the TiN film and one of the above regions (for example, a source/drain region), to reduce the contact resistance.

Further, in the above embodiments, tungsten silicide $WSi_2$ is used as a material for reducing the resistance of a gate electrode. However, the silicide of a metal having a high melting point other than tungsten, or a metal having a high melting point may be used in place of $WSi_2$.

Further, in the above description, a CMOS memory cell has been explained, by way of example. However, the present invention is not limited to the CMOS memory cell, but is applicable to other CMOS devices, bipolar devices, and a composite semiconductor integrated circuit device, in which CMOS circuits and bipolar transistors are formed on the same semiconductor substrate.

Specifically, the third embodiment of FIG. 6E can improve the mutual conductance (gm) of an LLDMOS transistor. Accordingly, the structure of FIG. 6 is not limited to a CMOS circuit, but is applicable to a single MOSFET.

Figure 10:
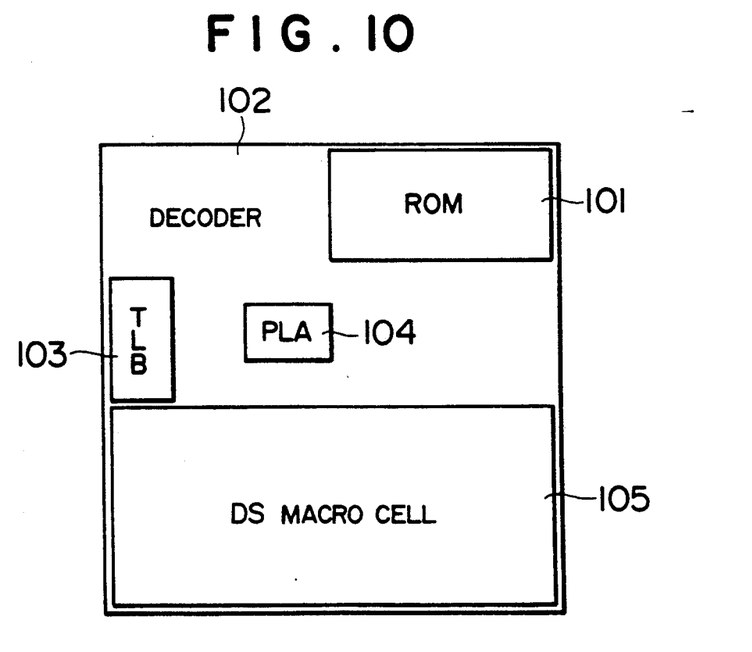
FIG. 10 is a schematic diagram showing an embodiment of a microprocessor according to the present invention.

Further, the present invention is applicable to the microprocessor shown in FIG. 10. As examplified in FIG. 10, a microprocessor includes a read only memory (ROM) 101, a decoder 102, a translation look-aside buffer (TLB) 103, a programmable logic array (PLA) 104, and a data structure (DS) macro cell 105. The decoder 102 decodes the contents of an instruction. A signal which is read out from the ROM 101 on the basis of a command from the PLA 104, is sent to the DS macro cell 105 through decoder 102, and various operations such as a logic operation are performed in the DS macro cell 105. The TLB L03 is used for carrying out address translation between a logical address and a physical address at high speed. The ROM L01 is usually formed of NMOS transistors, but may be made up of CMOS memory cells. Other parts than the ROM 101 are formed of CMOS or BiCMOS circuits. When a connecting structure according to the present invention or a MOSFET structure according to the present invention is used in the above parts of the microprocessor, the microprocessor can be made high in integration density and performance. A random access memory (RAM) which includes a multiplicity of CMOS memory cells according to the present invention, may be used in place of, or in addition to the ROM 101. The structure of FIG. 10 indicates an example of a microprocessor, and it is needless to say that the present invention is applicable to various microprocessors.

Although several embodiments of the present invention have been explained in the foregoing, the present invention is not limited to the embodiments, but various changes or modifications can be made without departing from the spirit and scope of the invention. Further, it is needless to say that each of the embodiments may be fabricated by other methods.

As has been explained in the foregoing, according to the present invention, two regions are connected to each other through a connecting conductor in such a manner that the connecting conductor is kept in ohmic contact with each of the regions in a very fine area. Accordingly, it is easy to make high the integration density and performance of a semiconductor integrated circuit device according to the present invention.

We claim:

1. A semiconductor integrated circuit device comprising:
   a field oxide film formed on a semiconductor substrate;
   a wiring conductor extended on the field oxide film, the width of the wiring conductor being defined by a pair of side-wall insulating films;
   a MOSFET formed on the semiconductor substrate and surrounded by the field oxide film; and
   a connecting conductor for connecting the wiring conductor and the source/drain region of the MOSFET, the connecting conductor being sandwiched between a side face of the wiring conductor and each of the side-wall insulating films.

2. A semiconductor integrated circuit device comprising:
   a plurality of MOSFET's formed on a semiconductor substrate; and
   a connecting conductor acting as a diffusion barrier for connecting the gate electrode of one of the MOSFET's and the source/drain region of another MOSFET, the connecting conductor being kept in contact with the gate electrode in a geometrical arrangement that the connecting conductor and the gate electrode do not overlap each other when viewed from above.

3. A semiconductor integrated circuit device comprising:
   a plurality of MOSFET's formed on a semiconductor substrate, a gate electrode of each of the MOSFET's having a three-layer structure formed of upper, middle and lower layers, the upper layer being formed of a polysilicon film, the middle layer being formed of an insulating film, the lower layer being formed of a film smaller in resistivity than the polysilicon film; and
   a connecting conductor for connecting the upper and lower layers of the gate electrode, the connecting conductor being kept in ohmic contact with each of the upper and lower layers in a geometrical arrangement that the connecting conductor and the upper layer do not overlap each other when viewed from above.

4. A semiconductor integrated circuit device comprising:
   a plurality of MOSFET's formed on a semiconductor substrate, a gate electrode of each of the MOSFET's having a three-layer structure formed of upper, middle and lower layers, the lower layer being formed of a polysilicon film, the middle layer being formed of an insulating film, and the upper layer being formed of a film smaller in resistivity than the polysilicon film; and
   a connecting conductor for connecting the upper and lower layers, the connecting conductor being kept in ohmic contact with each of the upper and lower layers,
   wherein the middle layer prevents diffusion of dopant impurities between the upper and lower layers, and
   wherein at least a drain region of each MOSFET has a lightly-doped portion, and at least the lightly-doped portion and the polysilicon film overlap each other.

5. A semiconductor integrated circuit device comprising:
   a plurality of MOSFET's formed on a semiconductor substrate, a gate electrode of each of the MOSFET's having a three-layer structure formed of upper, middle and lower layers, the lower layer being formed of a polysilicon film, the middle layer being formed of an insulating film, and the upper layer being formed of a film smaller in resistivity than the polysilicon film; and
   a connecting conductor for connecting the upper and lower layers, the connecting conductor being kept in ohmic contact with each of the upper and lower layers,
   wherein the middle layer prevents diffusion of dopant impurities between the upper and lower layers, and
   wherein the connecting conductor is kept in ohmic contact with each of the upper and lower layers at an end portion of each layer.

6. A semiconductor integrated circuit device comprising:
   a plurality of MOSFET's formed on a semiconductor substrate, a gate electrode of each of the MOSFET's having a three-layer structure formed of upper, middle and lower layers, the lower layers being formed of a polysilicon film, the middle layer being formed of an insulating film between main opposite surface portions of the upper and lower layers, and the upper layer being formed of a film smaller in resistivity than the polysilicon film;
   a connecting conductor for connecting at least edge portions of the upper and lower layers, the connecting conductor being kept in ohmic contact with each of the upper and lower layers,
   wherein the middle layer prevents diffusion of dopant impurities between the upper and lower layers, and
   wherein the connecting conductor kept in ohmic contact with the upper and lower layers acts as a diffusion barrier for the dopants contained in the upper and lower layers.

7. A semiconductor integrated circuit device comprising:
   a plurality of MOSFET's formed on a semiconductor substrate, a gate electrode of each of the MOSFET's having a three-layer structure formed of upper, middle and lower layers, the lower layer being formed of a polysilicon film, the middle layer being formed of an insulating film, and the upper layer being formed of a film smaller in resistivity than the polysilicon film; and a connecting conductor for connecting the upper and lower layers, the connecting conductor being kept in ohmic contact with each of the upper and lower layers, wherein the middle layer prevents diffusion of dopant impurities between the upper and lower layers, and wherein the MOSFET's are classified into N-channel MOSFET's and P-channel MOSFET's to form a CMOS circuit, the lower layer of a gate electrode bestriding the boundary between an NMOS region and a PMOS region is separated into the lower layer on the N-channel side and the lower layer on the P-channel side, the lower layer on the N-channel side is formed of an N-polysilicon film, the lower layer on the P-channel side is formed of a P-polysilicon film, a connecting conductor acting as a diffusion barrier is kept in ohmic contact with the upper layer and an end portion of the N-polysilicon film, and another connecting conductor acting as a diffusion barrier is kept in ohmic contact with the upper layer and an end portion of the P-polysilicon film.

8. A semiconductor integrated circuit device according to claim 7, wherein the N-polysilicon film is kept in ohmic contact with the source/drain region of an N-channel MOSFET, and the P-polysilicon film is kept in ohmic contact with the source/drain region of a P-channel MOSFET.

9. A semiconductor integrated circuit device according to claim 7, wherein the N-polysilicon film and the P-polysilicon film are separated from each other, on the surface of a field oxide film.

10. A semiconductor integrated circuit device comprising:

a plurality of N-channel MOSFET's and P-channel MOSFET's formed on a semiconductor substrate; and gate wiring bestriding the boundary between an N-channel MOSFET region and a P-channel MOSFET region and having a three-layer structure formed of upper, middle and lower layers, the lower layer being formed of a polysilicon film, the middle layer being formed of a conductive diffusion barrier film, the upper layer being formed of a film smaller in resistivity than the polysilicon film, the lower layer being separated into the lower layer on the N-channel side and the lower layer on the P-channel side, the lower layer on the N-channel side being formed of an N-polysilicon film, the lower layer on the P-channel side being formed of a P-polysilicon film, the conductive diffusion barrier film being kept in contact with the N-polysilicon film and the P-polysilicon film, to connect the N-polysilicon film and the P-polysilicon film.

11. A semiconductor integrated circuit device according to claim 10, wherein the N-polysilicon film is kept in ohmic contact with the source/drain region of an N-channel MOSFET, and the P-polysilicon film is kept in ohmic contact with the source/drain region of a P-channel MOSFET.

12. A semiconductor integrated circuit device comprising:

a plurality of MOSFET's formed on a semiconductor substrate, the gate electrode of each of the MOSFET's having a three-layer structure formed of upper, middle and low layers, the lower layer being formed of a polysilicon film, the middle layer being formed of an insulating film, the upper layer being formed of a film smaller in resistivity than the polysilicon film; and a connecting conductor for connecting the upper and lower layers, the connecting conductor being kept in ohmic contact with each of the upper and lower layers, wherein the middle layer prevents diffusion of dopant impurities between the upper and lower layers;

wherein the upper layer is formed of a film which is made of one of a metal having a predetermined melting point and the silicide of a metal having a predetermined melting point.

13. A semiconductor integrated circuit device comprising:

at least a pair of N-channel MOSFET and P-channel MOSFET formed on a semiconductor substrate; and gate wiring bestriding the boundary between an N-channel MOSFET region and a P-channel MOSFET region and having a multi-layered structure, a lower layer of the gate wiring being separated, on a field oxide film, into a layer on the N-channel side and a layer on the P-channel side, the layer on the N-channel side being formed of an N-polysilicon film, the layer on the P-channel side being formed of a P-polysilicon film, the gate wiring being connected to the source/drain region of the N-channel MOSFET by the N-polysilicon film, the gate wiring being connected to the source/drain region of the P-channel MOSFET by the P-polysilicon film, each of the N-polysilicon film and the P-polysilicon film being connected to the upper layer of the gate wiring through a conductive diffusion barrier layer, the upper layer being made of the silicide of a metal having a predetermined melting point.

14. A semiconductor integrated circuit device comprising:

at least a pair of N-channel MOSFET and P-channel MOSFET formed on a semiconductor substrate; and gate wiring bestriding the boundary between an N-channel MOSFET region and a P-channel MOSFET region and having a multi-layered structure, a lower layer of the gate wiring being separated, on a field oxide film, into a layer on the N-channel side and a layer on the P-channel side, the layer on the N-channel side being formed of an N-polysilicon film, the layer on the P-channel side being formed of a P-polysilicon film, the gate wiring being connected to the source/drain region of the N-channel MOSFET by the N-polysilicon film, the gate wiring being connected to the source/drain of the P-channel MOSFET by the P-polysilicon film, an insulating film being sandwiched between the upper layer and the lower layer, the N-polysilicon film and the P-polysilicon film being connected to each other in such a manner that each of the N-polysilicon film and the P-polysilicon film is connected to an end face of the upper layer through a conductive diffusion barrier, the upper layer being made of the silicide of a metal having a predetermined melting point.

15. A semiconductor integrated circuit device comprising:

a first region formed to be exposed at a first major surface of a semiconductor substrate and having one conductivity type, and a second region formed to be exposed at the first major surface of the semiconductor substrate and having the other conductivity type, an insulating film provide between the first region and the second region and on the first major surface of the substrate;

a first connecting conductor provided to extend on the insulating film and having a pair of end faces substantially normal to the first major surface; and a pair of second connecting conductors, one of which connects one of the end faces of the first connecting conductor to an exposed surface of the first region and another of which connects the other end face of the first connecting conductor to an exposed surface of the second region;

wherein at least one of the second connecting conductors is a conductive diffusion barrier and is made of one of a metal silicide and an alloy, the metal silicide is the silicide of at least one selected from a group consisting of titanium, tantalum, tungsten and molybdenum, and the alloy contains silicon, nitrogen and at least one selected from a group consisting of titanium, tantalum, tungsten and molybdenum.

16. A semiconductor integrated circuit device comprising:

a first region formed to be exposed at a first major surface of a semiconductor substrate and having one conductivity type, and a second region formed to be exposed at the first major surface of the semiconductor substrate and having the other conductivity type, an insulating film provided between the first region and the second region and on the first major surface of the substrate;

a first connecting conductor provided to extend on the insulating film and having a pair of end faces substantially normal to the first major surface; and a pair of second connecting conductors, one of which connects one of the end faces of the first connecting conductor to an exposed surface of the first region and another of which connects the other end face of the first connecting conductor to an exposed surface of the second region;

wherein the device is a static RAM including a multiplicity of CMOS memory cells.

17. A semiconductor integrated circuit device comprising:

a plurality of MOSFET's formed on a semiconductor substrate; and a connecting conductor acting as a diffusion barrier for connecting the gate electrode of one of the MOSFET's and the source/drain region of another MOSFET, wherein the connecting conductor is formed to have a first portion in contact with a side face of the gate electrode of said one of the MOSFETs and a second portion extending on the source/drain region of said another MOSFET, wherein a side spacer is formed on said connecting conductor adjacent to both said first and second portions of the connecting conductor, such that the connecting conductor separates the side spacer from the side face of the gate electrode and from the source/drain region, and wherein the length of the second portion extending on the source/drain region is defined by the lateral length of the side spacer extending above the source/drain region;

wherein the connecting conductor acting as a diffusion barrier is also used for forming a paid electrode is a contact hole.

18. A CMOS type memory integrated circuit device comprising at least one memory cell comprising a flip-flop circuit and first and second transfer MOS FETs; the flip-flop circuit including first and second P-channel MOS FETs and first and second driver N-channel MOS FETs; each source/drain region of the first P-channel MOS, driver N-channel MOS and transfer MOS FETs being connected to a gate electrode in common for the second P-channel and driver N-channel MOS FETs by means of a diffusion barrier material respectively; each source/drain region of the second P-channel MOS, driver N-channel MOS and transfer MOS FETs being connected to a gate electrode in common for the first P-channel MOS FET and the first driver N-channel MOS FET by means of a diffusion barrier material respectively; and the diffusion barrier materials being provided inside of side wall oxidation films provided at side walls of the gate electrodes.

* * * * *